United States Patent [19]

Palkovich et al.

[11] Patent Number: 5,012,217
[45] Date of Patent: Apr. 30, 1991

[54] INTGRATED ACTIVE SHIELDED MAGNET SYSTEM

[75] Inventors: Alex Palkovich, Oxford; John M. Bird, Oxon, both of England; Ratson Morad, Zichron Yakov, Israel

[73] Assignee: Elscint Ltd., Haifa, Israel

[21] Appl. No.: 512,358

[22] Filed: Apr. 23, 1990

[30] Foreign Application Priority Data

Apr. 23, 1989 [IL] Israel ................................ 090050

[51] Int. Cl.⁵ .............................................. H01F 7/00
[52] U.S. Cl. .................................... 335/301; 335/216; 324/318
[58] Field of Search ....................... 335/216, 301, 304; 324/318, 319, 320

[56] References Cited

U.S. PATENT DOCUMENTS 4,890,082 12/1989 Fujita ................................. 335/301

FOREIGN PATENT DOCUMENTS

| 0250675 | 1/1988 | European Pat. Off. ............ 335/301 |
| 62-5161 | 1/1987 | Japan ................................. 335/301 |
| 0166203 | 7/1988 | Japan ................................. 335/301 |
| 1-65809 | 3/1989 | Japan ................................. 335/301 |

Primary Examiner—George Harris
Attorney, Agent, or Firm—Sandler, Greenblum & Bernstein

[57] ABSTRACT

A hybrid shielding arrangement for solenoid type cryogenic magnets used in MR systems uses both active and passive shielding elements to improve the effective shielding.

17 Claims, 3 Drawing Sheets

INTEGRATED ACTIVE SHIELDED MAGNET SYSTEM

FIELD OF THE INVENTION

This invention is concerned with arrangements for magnetically shielding solenoid type magnets and more particularly with such arrangements used in magnetic resonance (MR) data acquisition systems. This Application relates to an earlier Patent Application entitled "Hybrid Shield for Magnets" assigned to the Assignee of this invention, which was filed in Isreal on June 30, 1988. and received Ser. No. 86934.

BACKGROUND OF THE INVENTION

When electromagnets are used to generate large magnetic fields it is often desirable or even necessary to shield the magnets to prevent the large magnetic fields from extending too far beyond the actual magnet. This is true, for example, in MR systems where the magnetic fields presently generated in the magnet center are in many cases two Tesla in strength. Such strong magnetic fields raise safety and other problems (see British Patent No. 1343275 which describes an active magnetic shielding method to prevent damage caused by stray magnetic fields of super-conducting magnets). For example, anybody entering within the magnetic field can seriously damage their magnetically encoded credit cards. Even more serious, however, is that anybody entering within such strong fields carrying a magnetizeable object such as a tool could have the tool pulled away. The object would then go hurtling like a missile through the air towards the center of the magnet. As a missile it could cause serious bodily harm. Another problem with strong magnetic fields that extend beyond the magnet is that they tend to raise havoc with pacemakers and other electronic devices.

To prevent the large magnetic fields from extending to a point where they can cause damage, it has been found necessary to shield the magnets. Basically, two types of shields are used: passive shield and active shields. With passive shields an electromagnet is surrounded by a material of low magnetic reluctance so that the magnetic flux lines outside the magnet (fringe field lines) tend to travel mainly within the material of low reluctance and not to extend appreciably beyond the material of low reluctance. A problem with such passive shields is that they add substantially to the weight and size of the magnetic resonance unit and further tend to upset the homogeneity of the field produced by the main field coils.

Alternatively, active magnetic shields have been used. Active shields are solenoid coils which surround the main solenoid coil and generate a magnetic field opposite in direction to the main magnetic field. The lines of force (flux) of the shielding solenoid coil cancel many of the lines of force of the main magnet and thereby decrease the external or fringe field of the main solenoid coil. A problem with actively shielded solenoid coils is that in addition to reducing the fringe field (i.e. lines of force outside the coil) of the magnet, lines of force within the magnet itself are also cancelled and thereby the main magnetic field is weakened.

In the past either:
(1) The main field coils have been designed to produce homogeneous fields and the shielding coils have also been designed to produce homogeneous fields so that the main field is homogeneous at the volume of data acquisition, or
(2) Both the main and shielding coil together produce a homogeneous field in the volume of data acquisition.

The above referred to Patent Application provides a hybrid shield for the fringe magnetic fields comprised of solenoid type magnets without appreciably reducing the strength of the magnetic field in the center portion of the main solenoid coil by combining an actively shielded solenoid coil and a passive shield located between the main solenoid coil and the shielding solenoid coil.

It is an object of the present invention to improve over the hybrid shield.

BRIEF DESCRIPTION OF THE INVENTION

In accordance with a broad aspect of the present invention, an active and a passive shield arrangement (a hybrid shielding arrangement) for solenoid cryogenic magnets used in magnetic resonance (MR) systems is provided to effectively reduce the fringe magnetic field generated by the magnet, said arrangement comprising:
- a cryogenic super conducting magnet arrangement contained in a dewar having an inner wall and an outer wall,
- a first solenoid coil within said dewar for generating a main large static magnetic field having lines of force in the center portion of the first solenoid coil extending in a first direction,
- a second solenoid coil within said dewar for generating a second static magnetic field with lines of force in the center portion of the first solenoid coil extending in the opposite direction to the lines of force generated by the first solenoid coil to cancel at least some of the lines of force that are external to the first solenoid coil.
- a first low reluctance means within said dewar for increasing flux lines in the path through said first low reluctance means between the first solenoid coil and the second solenoid coil to enable energizing the second solenoid coil with a lower current than would be used without the first low reluctance means in place between the first and the second solenoid coils, said first low reluctance means increasing the strength of the magnetic field at the center of the first solenoid coil compared to the strength of the magnetic field at the center of said first solenoid means in the absence of said first low reluctance means.
- a second low reluctance means for reducing flux lines external to said second solenoid coil, and
- said second low reluctance means comprising said outer wall of said cryogenic magnet arrangement.

In accordance with a feature of the present invention, the first low reluctance means between the first and the second solenoid coils being a magnetizable tube cylindrically surrounding the first solenoid coil and being cylindrically surrounded by the second solenoid coil.

According to yet another feature of the present invention, the magnetizable tube is fabricated from a mild steel.

In accordance with still another feature of the invention, the first and second solenoid coils provide inhomogeneous fields at the center data acquisition section of the magnet. The inhomogeneous fields are made homogeneous by first and second low reluctance means comprising a set of magnetizeable tubes cylindrically surrounding the solenoid coils.

BRIEF DESCRIPTION OF THE DRAWINGS

The above mentioned and other features and objects of the present invention will be best understood when considered in the light of the following description of a broad aspect of the present invention made in conjunction with accompanying drawings, wherein.

GENERAL DESCRIPTION

Figure 1:
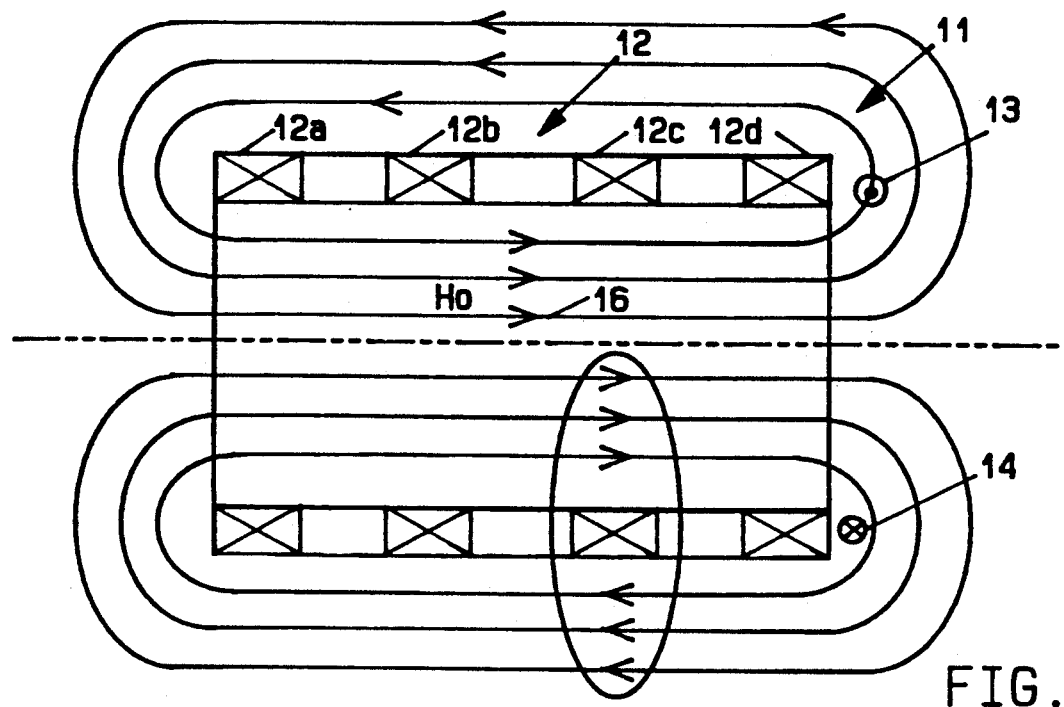
FIG. 1 is a schematic showing of a longitudinal cross section of a magnet comprising a solenoid coil set without any shielding.

In FIG. 1 a regular solenoid coil type magnet is shown at 11. It comprises coil set 12 wound to form a cylinder. In practice coil set 12 comprises a multiplicity of sub-coils, schematically shown as coils 12a-12d.

Theoretically, the more sub-coils the more homogeneous the field. The sub-coils are generally separately energized and not necessarily symmetrically placed to control the homogeneity of the field.

The coil set 12 is energized with current going as indicated by a dot and an x at 13 and 14, i.e., the current in the top part of the solenoid coils runs out of the paper and the current in the bottom of the solenoid runs into the paper. According to the right hand rule, the magentic field Ho is generated as shown with magnetic lines of force or flux running in the inner portion of the magnet in the direction of the arrow 16. The lines of force make closed loops around the bottom and the top of the solenoid magnet 11.

The lines of force extend far beyond the magnet but only the lines of force within the magnet are used for the MR data acquisition. Therefore, there is no operative impairment to shielding the external lines of force. When the magnetic lines of force are not shielded they may raise havoc with pacemakers and/or cause serious accidents by pulling metallic objects towards the center of the magnet at high speed.

Figure 2:
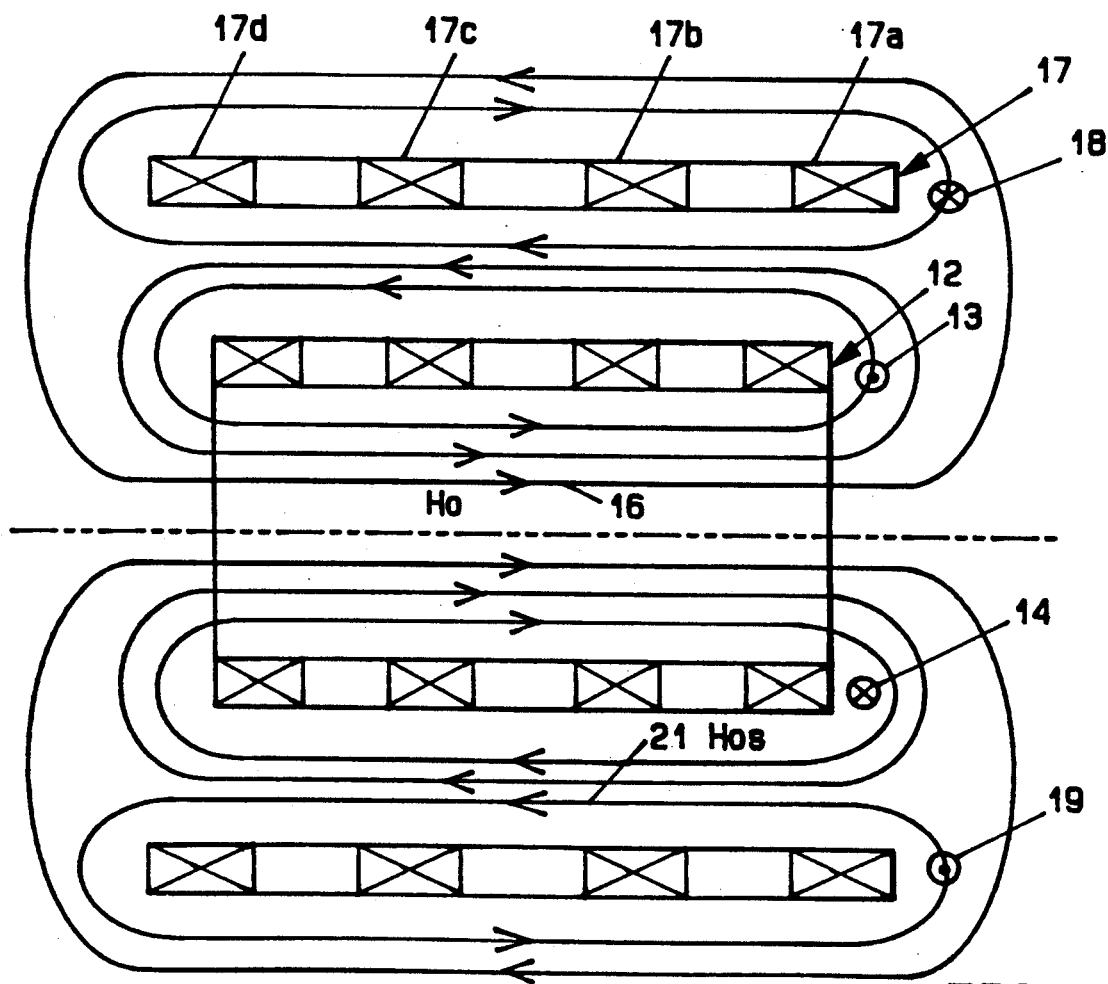
FIG. 2 shows longtiudinal sectional view of a magnet comprising a solenoid coil set, such as shown in FIG. 1, with active shielding.
Figure 3:
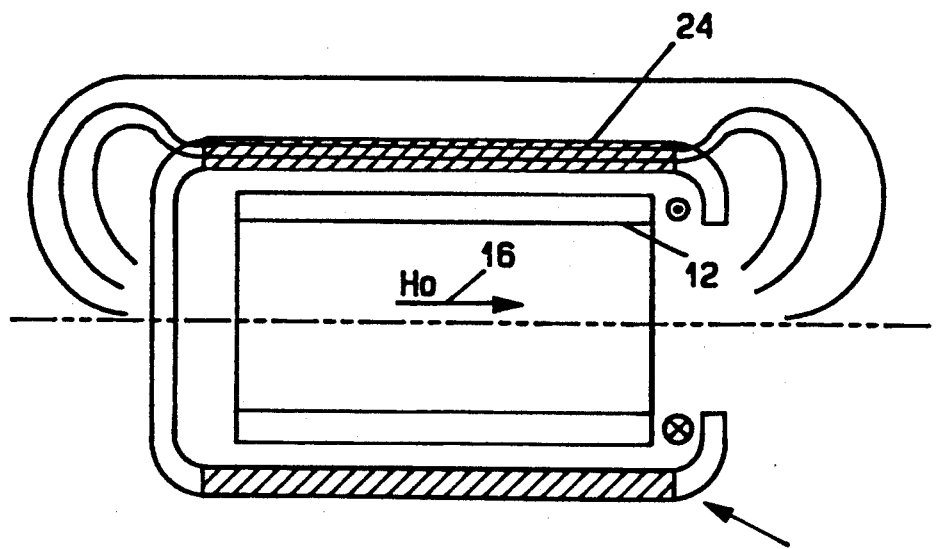
FIG. 3 shows the solenoid coil magnet of FIG. 1 with passive shielding.

In the prior art, the shielding has been either active as shown in FIG. 2 or passive as shown in FIG. 3. See U.S. Pat. No. 4,595,899 for prior art on active shielding in conjunction with an outer passive shield and U.S. Pat. No. 4,612,505 for prior art on passive shielding and on the use of non-solenoidal coils for active shielding in conjunction with passive shielding.

With active shielding, a second solenoid coil set indicated at 17 in FIG. 2 surrounds the first solenoid coil set 12. The second solenoid coil set also may comprise sub-coils such as coils 17a-17d. The direction of current in the second solenoid coil set is opposite to the direction of current in the first solenoid coil set. This is indicated by the x at 18 and the dot at 19 which are opposite in direction to the respective dot at 13 and the x at 14 of solenoid coil set 12. The magnetic field Ho(s) of the shield is directed oppositely to the main field Ho as indicated by arrow 21; i.e., the magnetic field due to the solenoid coil set 17 runs opposite in direction to the magnetic field of solenoid coil set 12.

Since the magnetic fields run in opposite direction, they tend to cancel. Since the magnetic field generated by the solenoid 12 is larger than the magnet field generated by solenoid 17 the cancellation is only partial and accordingly the shield solenoid 17 is effective for reducing the field outside the magnet; i.e., the fringe field, because its leakage field per turn is greater than that of the inner solenoid 12. However, it also reduces the field within the solenoid 12; i.e., the useful field of the arrangement.

A prior art passive shield is schematically shown in FIG. 3 wherein a passive metal shield 24 surrounds the main solenoid coil 12 which generates the magnetic field Ho used in an MRI system, for example. The passive shield offers a lower reluctance path for the lines of flux of the main magnet. Since lines of flux tend to take the path of lower reluctance, a large part of the external lines of flux pass through the shield and so not extend beyond the shield. To be effective, however, such a shield must practically enclose the main magnet, which requires a large shield unit with a consequent high weight factor and a substantial increase in size of the MR unit. The passive shield does not reduce the magnetic field within the system; if anything it increases it because it prevents the loss of lines of flux. However, the increase in size, weight and cost due to the passive shielding is a factor mitigating against the use of passive shielding, such as that shown in FIG. 3 where the passive shield is more than a tube, but extends around the active solenoid to practically completely enclose the active solenoid coil.

Figure 4:
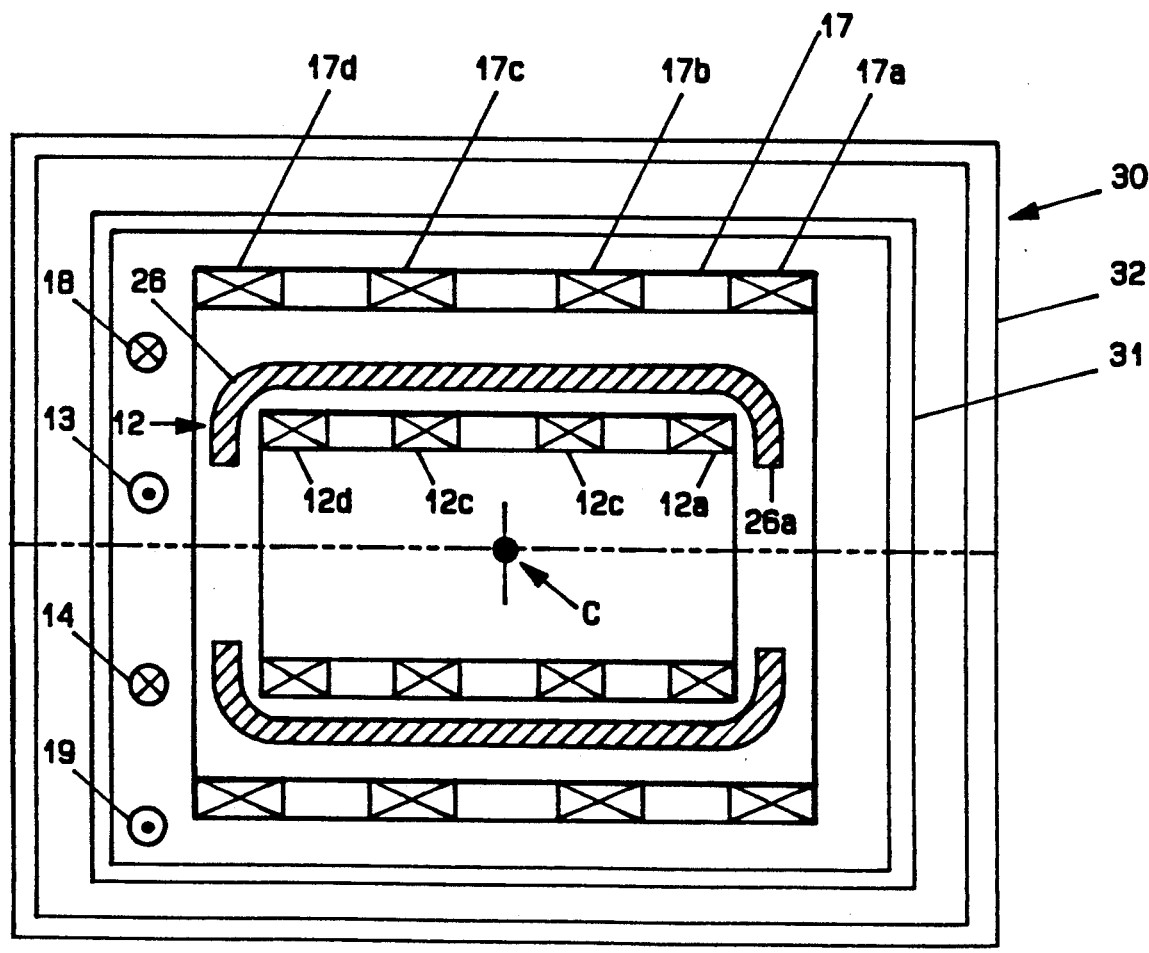
FIG. 4 shows the solenoid coil magnet of FIG. 1 with integrated shielding including using the outer shell of the cryogenic super conducting magnet arrangement as an outer passive shield.

FIG. 4 shows the inventive integrated shielding arrangement wherein the inner solenoid magnet coil 12 is shown surrounded by a reluctance reducing means such as magnetically permeable tube 26 that extends in a preferred embodiment as shown at 26a beyond the ends of the coil 12. In practice the dimensions of the tube are adjusted to maximize the shielding benefits. The tube 26 reduces the reluctance between the inner solenoid coil magnet 12 and the outer solenoid coil magnet 17.

The magnetic coils and the first reluctance reducing means are shown encased in a dewar 30. The dewar comprises an inner stainless steel wall 31 and an outer wall 32 of ferro-magnetic material such as mild steel. This outer wall 32 comprises a second means of providing a low reluctance path. The outer wall provides additional passive shielding with little or no additional weight or space.

The current is shown running in the same directions in the coils of FIG. 4 as was shown regarding the coils of FIG. 2. The direction of the currents is shown again by the circles with dots and "xs" at 13, 14, 18 and 19. The difference now is that magnetically permeable tube 26 by itself would reduce the fringe field. Therefore, a lower current can be used in the coil 17 to achieve the same shielding effect. The lower current in the shielding coil in turn generates less line of flux and thus the flux of coil 17 does not reduce the magnetic field at the center of 12 to the extent that the field is reduced by the arrangment of FIG. 2. Further the tube 26 can have a lower mass since its endeavours are aided by the coil 17 and the second low reluctance path. In addition, since the elements can be closer together the size of the magnet assembly is increased very little compared to the size of the arrangement of FIG. 2. Also since the first lower reluctance path can be less bulky, the weight and size increases are relatively minimal.

In one exemplary embodiment providing a 0.5 Tesla magnetic field, the coil set 12 is defined as follows: (zero pixel position is the central (radial) plane of the magnet).

| Sub Coil (cm) | Inner Radius (cm) | Outer Radius (cm) | First Axial Position (cm) | Second Axial Position (cm) | Turns |
|---|---|---|---|---|---|
| 12a | 55.5 | 56.6 | 5.9 | 11.2 | 660 |
| 12b | 55.5 | 56.6 | −5.9 | −11.2 | 660 |
| 12c | 57.2 | 58.4 | 24.5 | 33.7 | 1150 |
| 12d | 57.2 | 58.4 | −24.5 | −33.7 | 1150 |
| 12e | 60.5 | 61.7 | 54.5 | 78.7 | 3060 |
| 12f | 60.5 | 61.7 | −54.5 | −78.7 | 3060 |

The coil set 17 is defined as follows:

| Sub Coil (cm) | Inner Radius (cm) | Outer Radius (cm) | First Axial Position (cm) | Second Axial Position (cm) | Turns |
|---|---|---|---|---|---|
| 17a | 85.0 | 85.9 | 18.4 | 82.0 | 2240 |
| 17b | 85.0 | 85.9 | 18.4 | 82.0 | 2240 |

This design of the coil set will balance the following inhomogeneities arising in the shield:
Shield Contaminants
(inhomogeneities due to shield)
$Z2 = -2740$ ppm
$Z4 = +4770$ ppm
$Z6 = -25$ ppm
Where $Z_1, Z_2, \ldots Z_{n-1}, Z_n$ refer to axysymmetrical coefficients of terms in the Legendre series.

All of the coils are serially connected and have 160 amps running therethrough.

The shield 32 is fabricated from 20 mm gage steel and has a cylindrical radius of 106 cm and a length of 200 cm.

It should be noted that in place of the varied locations of the sub-coils of coil sets 12 and 17, the sub-coils could be separately energized to obtain the determined inhomogeneous fields that result in a homogeneous field in the complete assembly with the passive shields.

Figure 5:
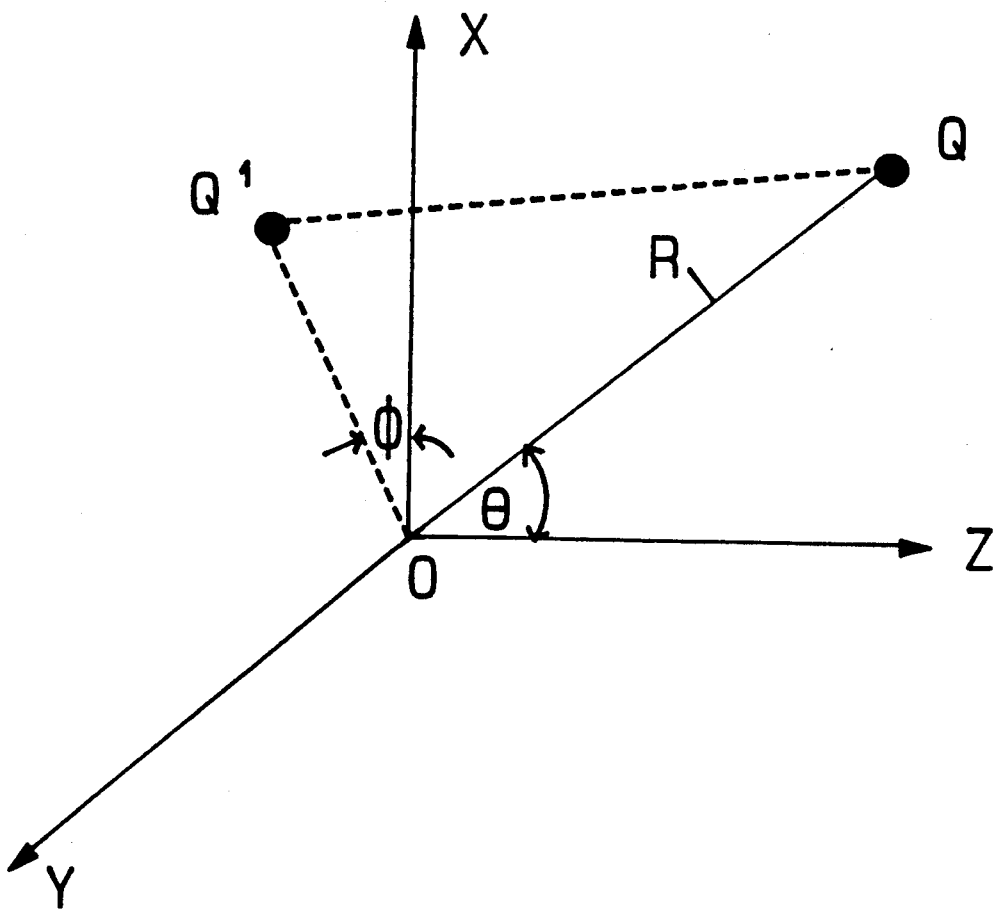
FIG. 5 is a coordinate showing of the relationship of the terms in the Legendre Equations.

The amount of inhomgeneity is determined as follows using the Legendre equations:

$$B_z(R, \Theta, \phi) = B_o \sum_{n=0}^{\infty} \sum_{m=0}^{n} P_{nm}(\cos\Theta)[A_{nm}\cos m\phi + B_{nm}\sin m\phi]R^n$$

where as shown in FIG. 5:
$B_z(R,\Theta,\phi)$ is the main large static magnetic field,
R is the distance of point Q from the origin (center of the magnet).
$\Theta$ is the angle of the OQ' line with the Z axis
$\phi$ is the angle between the line OQ and the positive X axis where Q' is the projection of the point Q on the XY plane.
$P_{nm}$ are the Legendre polynomials, and $A_{nm}$ and $B_{nm}$ are expansion coefficients of the magnetic field into spherical harmonics.

These equations represent a power series with axysymmetrical and non-axysymmetrical terms. The non-axysymmetrical terms are all zero. The axysymmetric terms; i.e., the terms symmetrical about the Z axial are labelled $Z_1, Z_2, Z_3 \ldots Z_n$. In the example, as given, the odd axysymmetrical terms $Z_1, Z_3 \ldots$ are also zero by symmetry.

The location of each of the sub-coils 12a–12d of coil 12 and sub-coils 17a–17d of coil 17 is adjusted or the currents in the sub-coils are individually adjusted so that the field of coil 12 in the center of the magnet and the field of coil 17 in the center of the magnet is inhomogeneous in a controlled way. Also the combination of fields is inhomogeneous. However, with the passive shielding in place the field at the center of the magnet becomes homogeneous.

Thus, there is provided a superconducting magnet that without passive shielding produces an inhomogeneous field. The magnet comprises two or more sets of coils, with each set at substantially a different radius. The set on the smallest radius is the basic magnet field producing set. The other set or sets produce active shielding. That is the field produced by the other set or sets runs opposite to the main field. Thus, the other set or sets contribute to shielding and subtract from the central bore field. The ferromagnetic shield is integrated with the active coils to:
1. Generate contributions to the terms of the external field to substantially reduce the external field in concert with the shielding coils; and to
2. Generate a set of contributions to the Legendre coefficients that describe the internal field in the central bore that are opposite of those of the main set of coils. For example, if the main set of coils produce a second order $Z_2$ contribution of plus 2000 parts per million (ppm), the passive shield produces a contribution of minus 2000 ppm; or if the main set of coils produces a $Z_2$ contribution of $-2000$ ppm, then the passive shields produce a $Z_2$ contribution of $+2000$ ppm. The action of the passive shield is similar for other orders $Z_4, Z_6, Z_8 \ldots Z_n$. The shield always adds to the $Z_0$ term.

Thus, when the whole device is correctly assembled, the total effect is a homogeneous central bore field with the external or stray field substantially reduced.

Because the low reluctance path is integrated with the coils as described above, the amount of superconductor is minimized for a given bore field. This may be understood by considering shielding factors as follows:

A shielding factor for the external field is defined as follows:
The volume enclosed by the 5 G contour without shielding divided by volume enclosed with shielding.

Current state of art active shielded magnets have shielding factors of up to 13.5. The integrated shielded magnet described herein has a shielding factor given by the shielding factor of the coils multiplied by the shielding factor of the iron; i.e., low reluctance path. This means that with a relatively small amount of iron—for example by using a cryostat with an iron outer shell, an iron shielding factor of four (4) is obtained resulting in a shielding factor (coils and iron) of 13.5×4 or 54.

Considering a high field (2 Tesla) magnet. It is well known that shielding factors greater than about 15 have remained unattainable.

With the teachings herein sets of coils can easily be constructed with shielding factor of 6–7. When integrated with a passive shield of a factor 6–7, a shielded system of total having a factor of 36–49 is produced.

The efficient integrated shield together with the inhomogeneous magnet results in shorter overall magnets. This effect is very advantageous from the point of view of patient access in the magnet, among other things.

In use, a shielding arrangement is provided that includes both the passive shield made up of the tube 26 of lower reluctance or high permeability that is slightly longer than the length of the main magnet. The tube of high permeability in turn is surrounded by a second solenoid which generates a magnet field opposite in direction to that of the first solenoid. The solenoids and the tube are located in a cryostat dewar. The cryostat outer wall 32 provides additional shielding.

The arrangement effectively reduces the fringe field without unduly increasing the weight and size of the magnet assembly.

While the invention has been described with regard to a preferred embodiment it should be understood that the description of the embodiment is made by way of example only and not as a limitation on the scope of the invention, which is defined by the accompanying claims.

What is claimed is:

1. An integrated shielding arrangement for solenoid type cryogenic super conducting magnets such as used in magnetic resonance (MR) systems to reduce the fringe magnetic fields generated by the solenoid magnet, said arrangement comprising:
   a dewar having an inner wall and outer wall,
   a first solenoid coil within said dewar for generating a first large static magnet field in a central bore of said magnet of the MR system, said field having a first lines of force extending in a first direction,
   a second solenoid coil within said dewar for generating an opposite going second magnetic field with second lines of force extending in an opposite direction to the first lines of force to cancel at least some of the first lines force external to the first solenoid to decrease fringe field effects, said second magnetic field also tending to decrease the lines of force in the central bore,
   first means for reducing the reluctance to flux lines located between the first and second solenoid coil to enable energizing the second coil with a lower current to assure less of a decrease in the central bore compared to the reduction of the magnetic field at the central bore when the first means for reducing the reluctance is absent, and
   second means for reducing the reluctance to flux lines located external to the second solenoid coil.

2. The integrated shielding arrangment of claim 1 wherein said second means includes the outer wall of the dewar.

3. The integrated shielding arrangement of claim 2 wherein said first solenoid coil and said second solenoid coil are an inner and an outer coaxial solenoid coil with the vertical center line of the inner and outer coaxial coils being aligned.

4. The integrated shielding arrangement of claim 1 wherein said first means for reducing the reluctance comprising a tubular member.

5. The integrated shielding arrangement of claim 4 wherein said tubular member is coaxial with said first and second solenoid coils.

6. The integrated shielding arrangement of claim 1 wherein said first solenoid coil generates an inhomogeneous field in the central bore of the first solenoid coil.

7. The integrated shielding arrangement of claim 1 wherein said second solenoid coil generates an inhomogeneous field in the central bore of the first solenoid coil.

8. The integrated shield arrangement of claim 1 wherein said first means for reducing reluctance comprises a set of magnetizeable members formed into a passive magnetic field shield.

9. The integrated shield arrangement of claim 1 wherein the field in the central bore due to the action of both solenoid coils and the first means for reducing reluctance is inhomogeneous.

10. The integrated shielding arrangement of claim 1 wherein the field in the central bore is homogeneous when the arrangement is complete.

11. The integrated shielding arrangement of claim 1 wherein said first solenoid coil comprises a plurality of separate first coils.

12. The integrated shielding arrangement of claim 1 wherein said second solenoid coil comprises a plurality of separate second coils.

13. The integrated shielding arrangement of claim 12 wherein the location of each said plurality of first coils provides at least part of the desired inhomogeneity due to said first coil.

14. The integrated shielding arrangement of claim 12 wherein the location of each of said plurality of second coils provides at least part of the desired inhomogeneity due to said second coil.

15. The integrated shielding arrangement of claim 12 wherein the current in each of said plurality of first coils provides at least part of the desired inhomogeneity due to said first coil.

16. The integrated shielding arrangement of claim 12 wherein the current in each of said plurality of second coils provides at least part of the desired inhomgeneity due to said second coil.

17. An integrated shielding arrangement for solenoid type cryogenic super conducting magents such as used in magnetic resonance (MR) systems to reduce the fringe magnetic fields generated by the solenoid magnet, said arrangement comprising:
   a first solenoid coil generating a first large static magnetic field in a central bore of said magnet of the MR system, said field having first lines of force extending in a first direction,
   a second solenoid coil for generating an opposite going second magnetic field with second lines of force extending in an opposite direction to the first lines of force to cancel at least some of the first lines force external to the first solenoid to decrease fringe field effects, said second magentic field also tending to decrease the lines of force in the central bore.
   first means for reducing the reluctance to flux lines located between the first and second solenoid coil to enable energizing the second coil with a lower current to assure less of a decrease in the central bore compared to the reduction of the magnetic field at the central bore when the first means for reducing the reluctance is absent, and
   second means for reducing the reluctance to flux lines located external to the second solenoid coil,
   said first solenoid coil generating an inhomogeneous field at the central bore,
   said second solenoid coil generating an inhomogeneous field at the central bore, and
   the field at the central bore being homogeneous when the arrangement is assembled with said first and second means for reducing the reluctance.

* * * * *